United States Patent
Matsubayashi et al.

[11] Patent Number: 5,426,399
[45] Date of Patent: Jun. 20, 1995

[54] FILM CARRIER SIGNAL TRANSMISSION LINE HAVING SEPARATING GROOVES

[76] Inventors: Hiroto Matsubayashi; Yasuharu Nakajima; Yoshihiro Notani, all of c/o Mitsubishi Denki Kabushiki Kaisha, Hikari Micro-ha Device Kenkyusho, 1 Mizuhara 4-chome, Itami-shi, Hyogo 664, Japan

[21] Appl. No.: 165,343

[22] Filed: Dec. 13, 1993

[30] Foreign Application Priority Data

Feb. 4, 1993 [JP] Japan ................... 5-017186

[51] Int. Cl.⁶ ............................... H01P 3/08
[52] U.S. Cl. .......................... 333/1; 333/238; 174/36; 174/117 FF
[58] Field of Search .............. 333/1, 238, 246; 174/36, 117 FF

[56] References Cited

U.S. PATENT DOCUMENTS 3,370,256 2/1968 Baur et al. ................. 333/238 X
4,845,311 7/1989 Schreiber et al. ............... 333/1 X

FOREIGN PATENT DOCUMENTS 155025 5/1982 German Dem. Rep. ....... 174/117 F
61-277111 12/1986 Japan .
1146426 10/1989 Japan .
41803 2/1991 Japan ................... 333/238
3211870 9/1991 Japan .
4294602 10/1992 Japan ................... 333/238
1243764 3/1970 United Kingdom .
9222939 12/1992 WIPO .

Primary Examiner—Benny T. Lee

[57] ABSTRACT

A film carrier signal transmission line includes a dielectric material having a first, front surface and a second, rear surface opposite the first surface, signal lines buried in the dielectric material for transmitting a super high frequency signal, spaced from the first and second surfaces, and spaced side-by-side at a regular interval; a first grounding film disposed on the second surface of the dielectric material; separating grooves in the dielectric material between adjacent pairs of signal lines, parallel to the signal lines; and second grounding films disposed on the first surface of the dielectric material and in the separating grooves and electrically connected with said first grounding film in the separating grooves. Adjacent signal lines are electrically shielded and crosstalk between signal lines is reduced.

5 Claims, 6 Drawing Sheets

FILM CARRIER SIGNAL TRANSMISSION LINE HAVING SEPARATING GROOVES

FIELD OF THE INVENTION

The present invention relates to a film carrier signal transmission line, and more particularly, to a structure thereof that is employed for mounting the film carrier signal transmission onto a semiconductor integrated circuit operating at a super high frequency and at a super high speed, or in connections between a plurality of semiconductor integrated circuits.

BACKGROUND OF THE INVENTION

Figure 8:
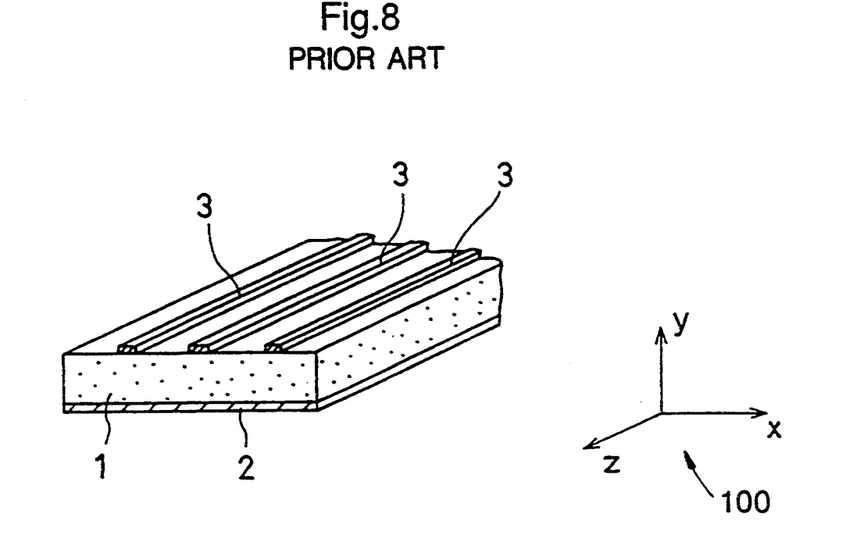
FIG. 8 is a perspective view illustrating a prior art film carrier signal transmission line.

FIG. 8 is a perspective view illustrating a prior art film carrier signal transmission line. In FIG. 8, reference numeral 1 designates a dielectric film such as polyimide. First metal films 3 each comprising a copper thin film or the like and having a predetermined width are disposed on a first or front surface of the dielectric material film 1 as signal lines. A second metal film 2 is disposed on a second or rear surface of the dielectric material film 1 as a ground plane.

This prior art film carrier signal transmission line operates as follows.

The film carrier signal transmission line as shown in FIG. 8 is used for such as connections between circuits in the same package, in which the copper thin film 2 functions as a ground plane and the copper thin films 3 respectively function as a signal line, and the electromagnetic wave (hereinafter referred to as RF signal) is transmitted on the transmission line that is constituted by each of the copper thin film signal lines 3 and the copper thin film ground plane 2 of a predetermined line impedance in the Z direction Axes 100 indicate the X, Y, and Z directions.

Figure 9:
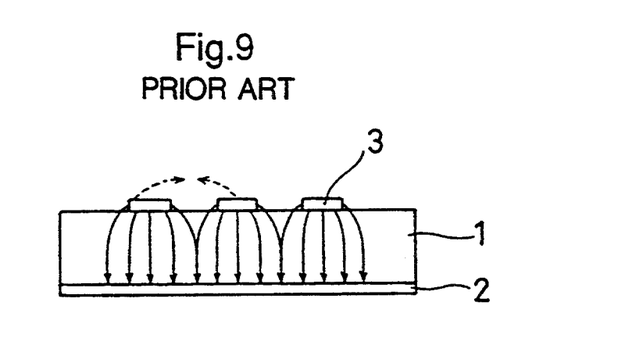
FIG. 9 is a diagram illustrating the electric field distribution of the signal transmission line of FIG. 8.

The prior art film carrier signal transmission line of the microstrip line structure has the following problems. That is, when the respective signal lines are disposed much closer to each other with increasing integration density, mutual interference, i.e., crosstalk between signal lines, increases and transmission loss increases. FIG. 9 illustrates crosstalk between signal lines as shown by arrows 10.

In addition, at the mounting portion of the film carrier signal transmission line with a semiconductor integrated circuit operating up to millimeter-wave band frequencies and at the connecting portion of a plurality of such semiconductor integrated circuits, there occur reflections of RF signals due to impedance mismatching at the connecting portions between the transmission line and the circuits, unfavorably increasing the transmission loss.

Meanwhile, as a technique relating to the above-described film carrier transmission line, as disclosed in Japanese Published Patent Applications 3-14486 and 1-207937, in order to reduce the reflections of high frequency signals and to stabilize input and output impedance, there is provided a technique of embedding signal lines in an insulating film, providing ground planes at the both surfaces of the insulating film, and connecting the ground planes through via-holes. In this technique, however, the via-holes positioned between adjacent signal lines cannot contribute to a reduction in crosstalk, resulting in a large transmission loss as in the above-described prior art.

SUMMARY OF THE INVENTION

It is an object of the present invention to provide a film carrier signal transmission line with reduced crosstalk between signal lines even if a plurality of signal lines are disposed closer to each other on a film carrier comprising polyimide.

It is another object of the present invention to provide a film carrier signal transmission line that avoids an increase in transmission loss of the input signal caused by the reflections due to impedance mismatching in the transmission of the RF signal.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to the those skilled in the art from this detailed description.

A film carrier signal transmission line according to a first aspect of the present invention includes a dielectric material having a first or front surface and a second or rear surface opposite the first or front surface, a plurality of signal lines for transmitting a super high frequency signal embedded in the dielectric material film carrier at predetermined intervals, a grounding line or a ground plane disposed on the second or rear surface of the dielectric material film carrier, a separating groove provided at a region of the film carrier between the adjacent signal lines and along the signal lines, and second grounding conductor films disposed on the first surface of the film carrier and in the separating groove, electrically connected with the first grounding conductor film via the separating groove.

By this construction, adjacent signal lines are electrically shielded and the crosstalk between signal lines is reduced.

A film carrier signal transmission line according to a second aspect of the present invention includes a dielectric material having a first surface and a second surface opposite the first surface, a plurality of signal lines for transmitting a super high frequency signal embedded in the dielectric material film carrier at predetermined intervals, a grounding line or a ground plane disposed on the second surface of the dielectric material film carrier, a separating groove provided at a region of the film carrier between the adjacent signal lines and along the signal lines, and second grounding conductor films disposed on the first surface of the film carrier and in the separating groove, electrically connected with the first grounding conductor film via the separating groove. Therefore, the film carrier signal transmission line and the circuit can be connected as signal lines of a coplanar type and the impedance mismatching at the connecting part is reduced.

In a film carrier signal transmission line according to a third aspect of the present invention, the signal lines extend out from the film carrier at their ends, and grounding conductor extending portions are provided at both sides of the extending signal lines, the grounding conductor extending portions are connected to the first and second grounding conductor films, end portions of which are connected to each other, and a space between the grounding conductor extending portions is filled with the dielectric material film carrier.

In a film carrier signal transmission line according to a fourth aspect of the present invention, slits having a predetermined width and depth are provided at the second grounding conductor film above the signal lines. Therefore, the impedance at the end portion of the signal transmission line varies smoothly.

In a film carrier signal transmission line according to a fifth aspect of the present invention, foamed material is employed as the dielectric film material. Therefore, the dielectric constant of the dielectric material constituting the transmission line is reduced.

BRIEF DESCRIPTION OF THE DRAWINGS

In all figures the same elements are given the same reference numerals.

DETAILED DESCRIPTION OF THE PREFERRED EMBODIMENTS

Embodiment 1

Figure 1:
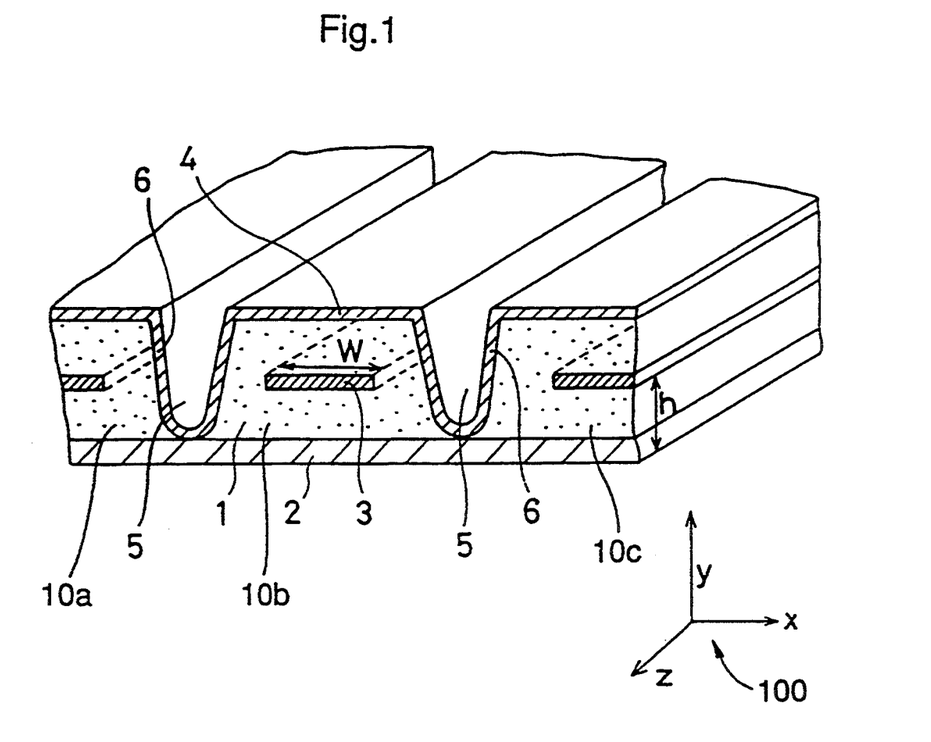
FIG. 1 is a perspective view illustrating a film carrier signal transmission line in accordance with a first embodiment of the present invention.

FIG. 1 illustrates a film carrier signal transmission line in accordance with a first embodiment of the present invention. In FIG. 1, reference numeral 1 designates a film carrier comprising polyimide. A ground plane 2 comprising a first copper thin film is disposed on the rear surface of the polyimide film 1. A second copper thin film 3 as a signal line is provided in the polyimide film at a height h from the ground plane 2 and having a width of w to attain a desired line impedance. A third copper thin film 4 is disposed on the surface of the polyimide film laminated on the second layer copper thin film 3 and this copper thin film 4 is connected to the ground plane 2 by the copper thin film 6 produced in the separating groove 5 provided on the polyimide film 1. In addition, the width of the copper thin film 4 is set so that the copper thin film 6 does not short-circuit with the signal line 3.

The function and effect of the film carrier signal transmission line of this embodiment will be described.

Figure 2:
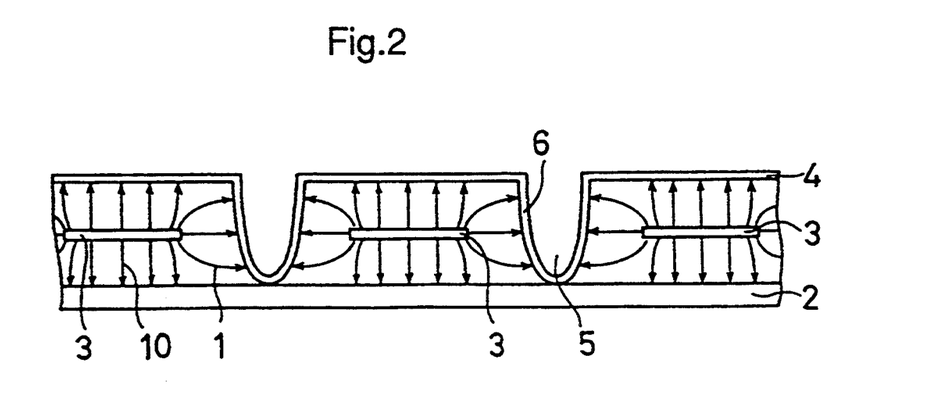
FIG. 2 is a diagram illustrating the electric field distribution during transmitting signals on the film carrier signal transmission line of the first embodiment.

The ground plane 2, and the copper thin films 4 and 6 function as a ground plane or a grounding line for the signal transmission line of copper thin film 3, and the electro-magnetic waves of an electric signal are transmitted in the Z direction on the transmission line of a predetermined line impedance constituted by the copper thin films 2, 3, 4, and 6. Axes 100 indicate the X, Y, and Z directions. As illustrated in FIG. 2, a separating groove 5 is produced between adjacent copper thin films 3 and a copper thin film 6 is disposed in the groove 5, so that the spaces 10a, 10 b, and 10c, as shown in FIG. 1, surrounding each of the adjacent copper thin films 3 are electrically shielded as shown by the electric field lines 10, and generation of crosstalk is prevented, whereby a low loss signal transmission line is realized.

The production method of the film carrier signal transmission line of this embodiment will be described below.

For example, a polyimide film of a predetermined thickness is produced on the copper thin film 2, copper thin film material to be the signal line is plated on the entire surface thereof, this copper thin film material is processed to a signal line of a predetermined line width by such as photolithography, and further polyimide is deposited thereon, thereby producing a structure with a buried signal line 3 in the polyimide film 1. Then, a copper thin film 4 to be a ground plane is produced on the entire surface of the polyimide film 1. Thereafter, a predetermined portion of the polyimide film 1 is etched employing a solution of ferric chloride. A separating groove 5 which reaches the copper thin film 2 is produced by employing a developer for photolithography and another copper thin film 6 is produced only in the separating groove, thereby producing the structure shown in FIG. 1.

In this first embodiment, the copper thin film 3 is surrounded by the grounding conductor, and therefore, crosstalk can be prevented even when adjacent copper thin films 3 are close to each other, and further even when the width of the separating groove 5 is narrowed. Thus, a signal transmission line advantageous to high density integration is provided.

Embodiment 2

Figure 3:
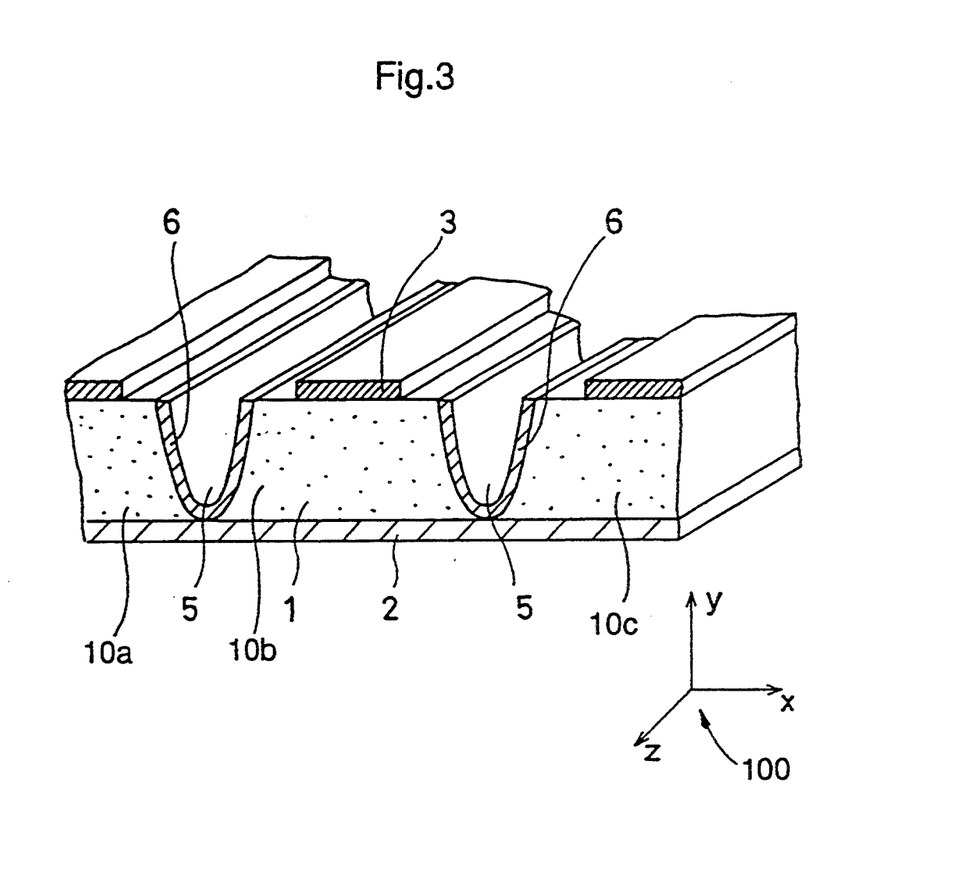
FIG. 3 is a perspective view illustrating a film carrier signal transmission line in accordance with a second embodiment of the present invention.

FIG. 3 is a diagram showing a film carrier signal transmission line in accordance with a second embodiment of the present invention. As illustrated in FIG. 3, a micro strip line is constituted by a copper thin film 2 and a signal line 3, and a separating groove 5 reaches the copper thin film 2 on a portion of the polyimide film 1 between the respective signal lines 3, and another copper thin film 6 is disposed in the separating groove 5.

Figure 4:
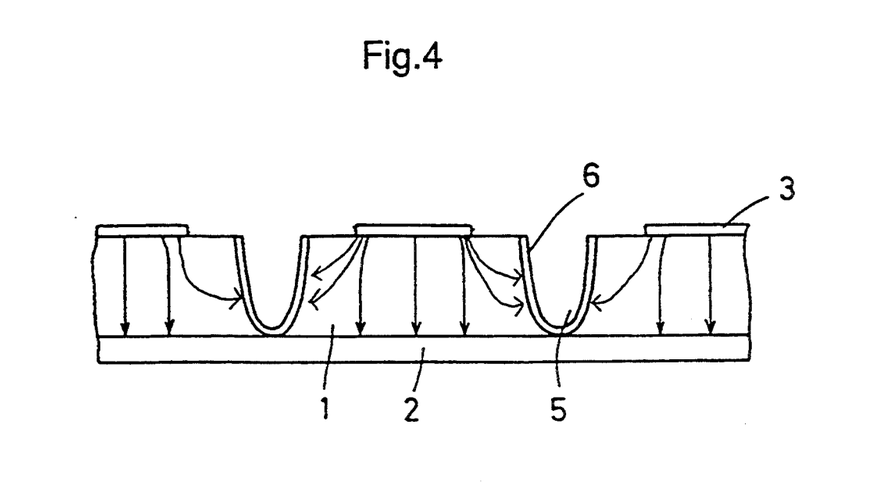
FIG. 4 is a diagram illustrating the electric field distribution during transmitting signals on the film carrier signal transmission line of the second embodiment.

In this second embodiment, the ground plane 2 and the copper thin film 6 function as a ground plane or a grounding line, and the copper thin film 3 functions as a signal line, and the electric signal is transmitted on these transmission lines in the Z direction Axes 100 indicate the X, Y, and Z directions. Because the copper thin film 6 connected to the ground plane 2 and having the same grounded voltage is disposed in the separating groove 5 between the adjacent copper thin films 3, the spaces 10a, 10b, and 10c surrounding the respective adjacent copper thin films 3 are electrically shielded from each other by the copper thin film 6 as shown in FIG. 4. Thereby, a low loss signal transmission line is realized. In addition, the signal line 3 is not buried in the polyimide film 1 and therefore this structure can be easily manufactured relative to the first embodiment. FIG. 4 is a diagram illustrating the electric field distribution during the transmission of signals. As illustrated in FIG. 4, a separating groove 5 is produced between adjacent copper thin films 3, and a thin film 6 is disposed in the groove, so that spaces 10a, 10b, and 10c, shown in FIG. 3, adjacent the copper thin films 3 are electrically shielded, as shown by arrows 10 representing electric field lines.

Embodiment 3

Figure 5:
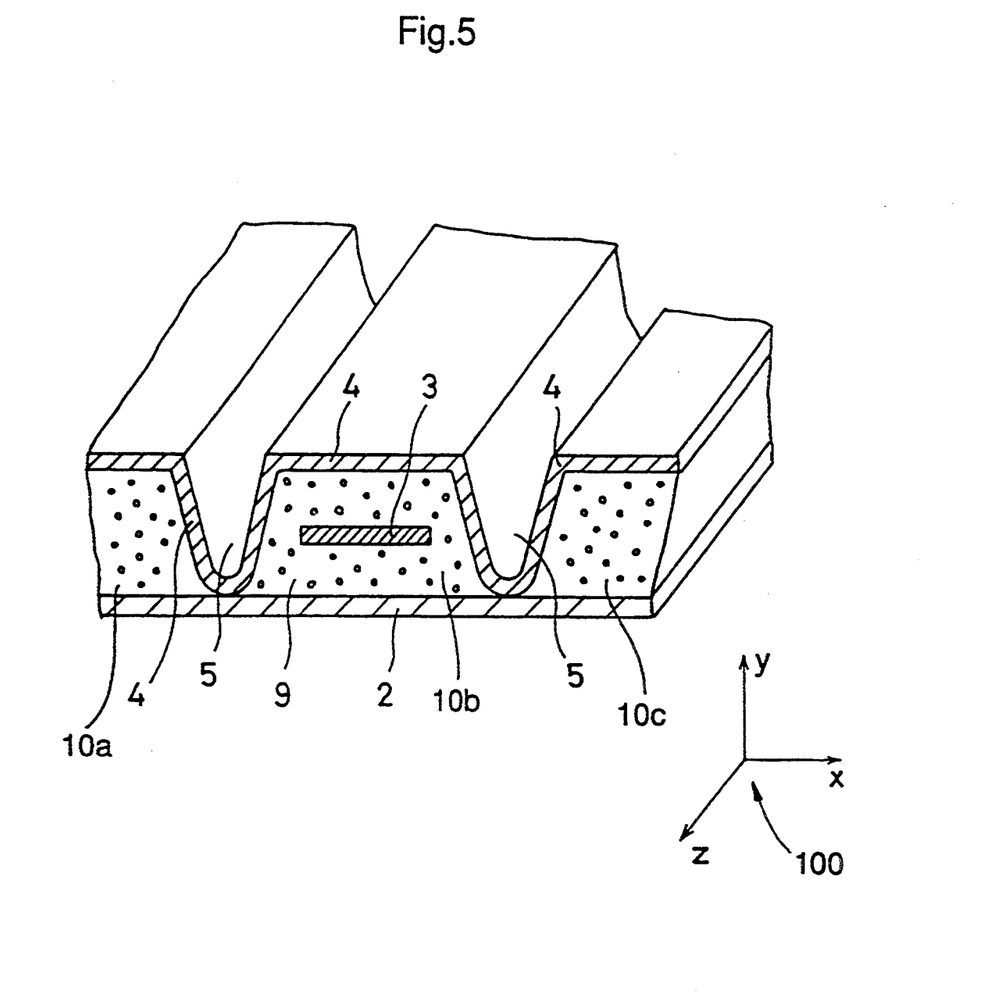
FIG. 5 is a perspective view illustrating a film carrier signal transmission line in accordance with a third embodiment of the present invention.

FIG. 5 illustrates a third embodiment of the present invention. In this embodiment, the structure of FIG. 1 is modified by using a foamed material 9, for example, low density polyethylene, in place of the polyimide 1, to constitute a carrier signal transmission line.

In this third embodiment, the ground plane 2 and the copper thin film 4 function as ground planes and the copper thin film 3 functions as a signal line, and the electric signal is transmitted in the Z direction Axis 100 indicate the X, Y, and Z directions.

By this construction, relative to the first embodiment, since the foamed material 9 is employed in place of the polyimide 1, the dielectric constant of the dielectric material is reduced and the loss upon transmitting an RF signal is suppressed.

Embodiment 4

Figure 6:
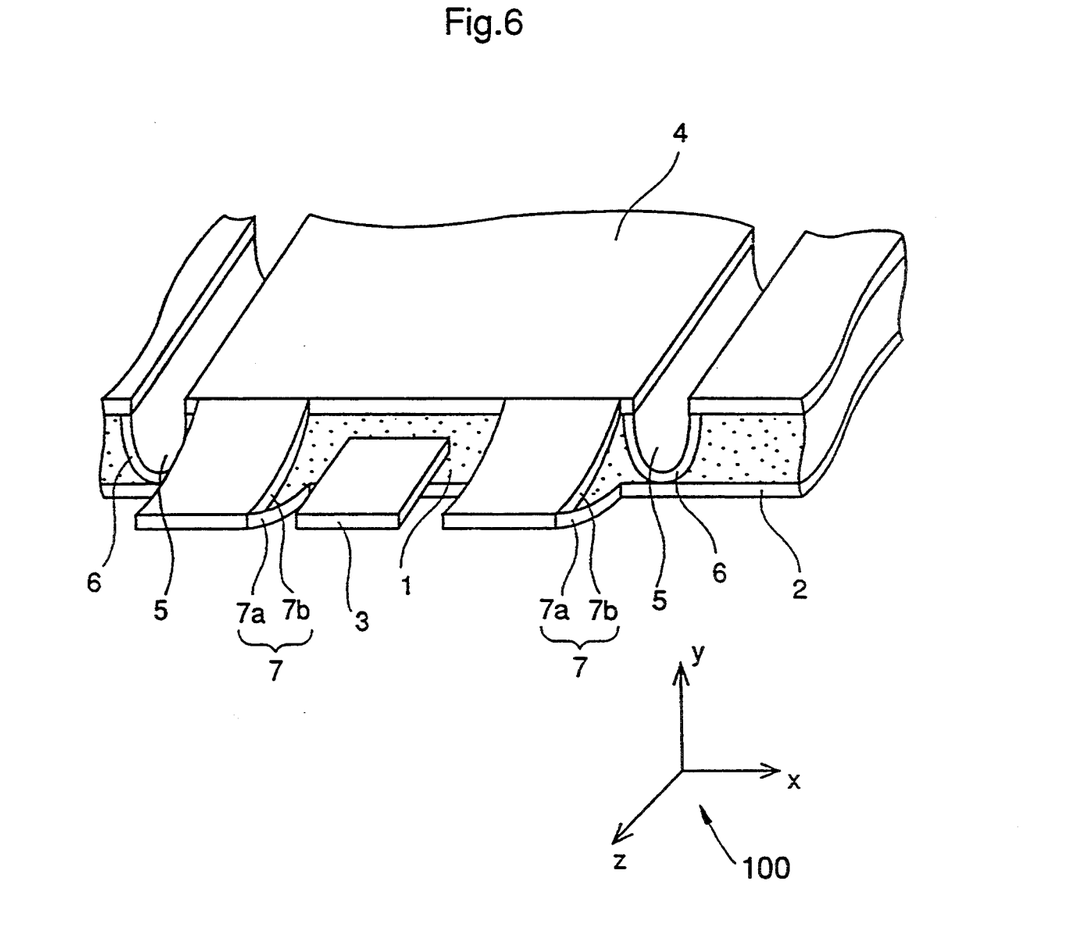
FIG. 6 is a perspective view illustrating a film carrier signal transmission line in accordance with a fourth embodiment of the present invention.

FIG. 6 illustrates a fourth embodiment of the present invention. In this fourth embodiment, the copper thin film 3 in the film carrier signal transmission line of the structure shown in FIG. 1 is taken out at the end of the signal transmission line. The copper thin films 7a and 7b connected with the copper thin film 2 and the copper thin film 4, respectively, are provided at the left and right sides of copper thin film 3 and spaces between the copper thin films 7a and 7b are filled with polyimide film 1. The top ends of the copper thin films 7a and 7b are both connected to constitute a polyimide tapered copper thin film 7.

In this fourth embodiment, because a coplanar line is constituted by the copper thin film 7 at both sides of the signal line 3, impedance mismatching at the connecting part of the mounting portion with the semiconductor integrated circuit and the connecting portion between a plurality of semiconductor integrated circuits is reduced, and the transmission loss of RF signal is suppressed. The electric signal is transmitted in the Z direction. Axes 100 indicate the X, Y, and Z directions.

Embodiment 5

Figure 7:
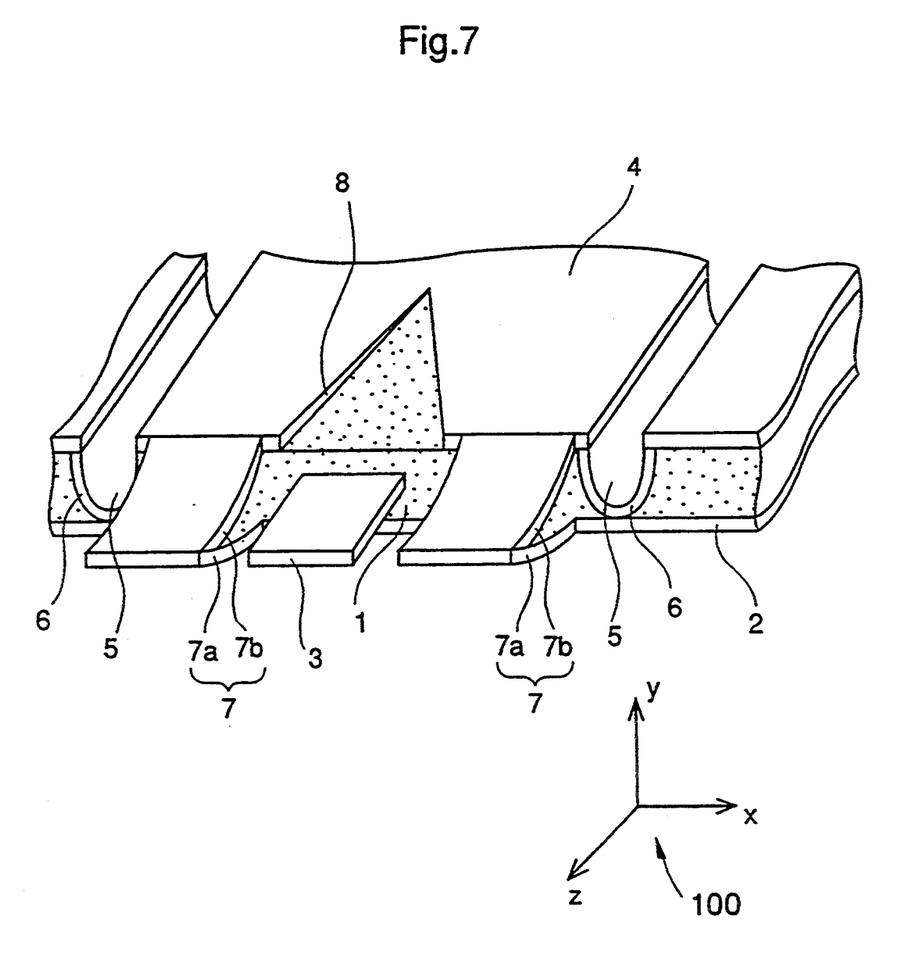
FIG. 7 is a perspective view illustrating a film carrier signal transmission line in accordance with a fifth embodiment of the present invention.

FIG. 7 illustrates a film carrier signal transmission line in accordance with a fifth embodiment of the present invention. As illustrated in FIG. 7, V shaped slits 8 are disposed in the copper thin film 4 located above the copper thin film 3 in the film carrier signal transmission line as shown in FIG. 6.

By providing the above-described slits 8, the impedance of the signal line 3 at the end part of the signal transmission line gradually varies, and impedance mismatching at the connecting portion of the mounting portion with a semiconductor integrated circuit and connecting portions between a plurality of semiconductor integrated circuits is further reduced.

While in the above-described third embodiment, foamed material is employed in place of polyimide, minute hollow spheres (Microballoons from Phyllite, England) can be mixed in the polyimide film with the same effects as described above.

While in the above-described fifth embodiment, a V shaped slit is produced, the shape of the slit is not limited to the V shape and any arbitrary shape which can smoothly vary the impedance at the end of the transmission line can be employed with the same effect as described above. The electric signal is transmitted in the Z direction. Axes 100 indicate the X, Y, and Z directions.

What is claimed is:

1. A film carrier signal transmission line comprising:
   a dielectric material having a first, front surface and a second, rear surface opposite said first surface;
   a plurality of signal lines for transmitting a signal disposed on said first surface of said dielectric material and spaced side-by-side from each other at a uniform interval;
   a first grounding film disposed on said second surface of said dielectric material;
   a respective separating groove in said dielectric material extending from said first surface to said second surface between each pair of adjacent signal lines, parallel to said signal lines; and
   respective second grounding films disposed on said dielectric material in the respective separating grooves, each said second grounding film electrically connected with said first grounding film in the respective separating grooves.

2. The film carrier signal transmission line as defined in claim 1 wherein said dielectric material is a foam material.

3. A film carrier signal transmission line comprising:
   a dielectric material having a first, front surface and a second, rear surface opposite said first surface;
   a plurality of signal lines for transmitting a signal buried within said dielectric material, spaced from said first and second surfaces, and spaced side-by-side from each other at a uniform interval;
   a first grounding film disposed on said second surface of said dielectric material;
   a respective separating groove in said dielectric material extending from said first surface to said second surface between each pair of adjacent signal lines, parallel to said signal lines; and
   a second grounding film disposed on said first surface of said dielectric material and in each separating groove, each said second grounding film electrically connected with said first grounding film in the respective separating grooves, wherein said signal lines extend beyond said dielectric material and including grounding conductor extending portions respectively extending from said first and second grounding films, said grounding conductor extending portions being connected to each other, and including a dielectric material filling space between said grounding conductor extending portions.

4. The film carrier signal transmission line as defined in claim 3 wherein said second grounding film, including respective slits, each slit having a predetermined width and depth and being disposed opposite a respective one of said signal lines.

5. The film carrier signal transmission line as defined in claim 3 wherein said dielectric material is a foam material.

\* \* \* \* \*

UNITED STATES PATENT AND TRADEMARK OFFICE
CERTIFICATE OF CORRECTION

PATENT NO. : 5,426,399
DATED : June 20, 1995
INVENTOR(S) : Matsubayashi et al.

It is certified that error appears in the above-identified patent and that said Letters Patent is hereby corrected as shown below:

On the title page,

Insert --Item [73] Assignee: Mitsubishi Denki Kabushiki Kaisha, Tokyo, Japan--.

Signed and Sealed this

Twenty-second Day of June, 1999

Q. TODD DICKINSON

*Attest:*

*Attesting Officer*     Acting Commissioner of Patents and Trademarks